(12) United States Patent
Ku

(10) Patent No.: US 6,184,135 B1
(45) Date of Patent: Feb. 6, 2001

(54) INSITU FORMATION OF TISI$_2$/TIN BI-LAYER STRUCTURES USING SELF-ALIGNED NITRIDATION TREATMENT ON UNDERLYING CVD-TISI$_2$ LAYER

(75) Inventor: Tzu-Kun Ku, Taipei (TW)

(73) Assignee: Industrial Technology Research Institute, Hsin-Chu (TW)

( * ) Notice: Under 35 U.S.C. 154(b), the term of this patent shall be extended for 0 days.

(21) Appl. No.: 09/163,378

(22) Filed: Sep. 30, 1998

Related U.S. Application Data

(62) Division of application No. 08/954,047, filed on Oct. 20, 1997, now Pat. No. 5,856,237.

(51) Int. Cl.$^7$ ................. H01L 21/44; H01L 21/3205; H01L 21/4763
(52) U.S. Cl. ................. 438/683; 683/586; 683/904
(58) Field of Search ................. 257/754; 438/233, 438/558, 542, 586, 754, 625, 683

(56) References Cited

U.S. PATENT DOCUMENTS

| | | | | |
|---|---|---|---|---|
| 4,501,769 | * | 2/1985 | Hieber et al. ................. | 427/95 |
| 4,608,271 | * | 8/1986 | Hieber et al. ................. | 427/38 |
| 4,668,530 | * | 5/1987 | Reif et al. ................. | 427/55 |
| 4,684,542 | * | 8/1987 | Jasinski et al. ................. | 437/245 |
| 4,851,369 | | 7/1989 | Ellwanger et al. ................. | 437/200 |
| 4,926,237 | | 5/1990 | Sun et al. ................. | 357/71 |
| 5,103,272 | | 4/1992 | Nishiyama ................. | 357/23.4 |
| 5,104,694 | * | 4/1992 | Saito et al. ................. | 427/255 |
| 5,316,977 | * | 5/1994 | Kunishima et al. ................. | 437/200 |
| 5,344,792 | * | 9/1994 | Sandhu et al. ................. | 437/200 |
| 5,376,405 | * | 12/1994 | Doan et al. ................. | 437/225 |
| 5,545,592 | | 8/1996 | Iacoponi ................. | 437/200 |
| 5,558,910 | * | 9/1996 | Telford et al. ................. | 427/255 |
| 5,565,382 | * | 10/1996 | Tseng et al. ................. | 437/200 |
| 5,656,546 | * | 8/1997 | Chen et al. ................. | 438/586 |
| 5,739,046 | * | 4/1998 | Lur et al. ................. | 437/190 |
| 5,759,899 | * | 6/1998 | Saito ................. | 438/303 |
| 5,834,846 | * | 11/1998 | Shinriki et al. ................. | 257/754 |
| 5,856,237 | * | 1/1999 | Ku ................. | 438/683 |
| 5,897,365 | * | 4/1999 | Matsubara ................. | 438/592 |
| 5,950,083 | * | 9/1999 | Inoue et al. ................. | 438/233 |
| 6,071,552 | * | 6/2000 | Ku ................. | 427/99 |

* cited by examiner

Primary Examiner—Richard Booth
Assistant Examiner—Walter L. Lindsay, Jr.
(74) Attorney, Agent, or Firm—George O. Saile; Stephen B. Ackerman; William J. Stoffel

(57) ABSTRACT

The present invention provides a method of forming a contact structure comprised of: a silicon substrate, a titanium silicide layer, a barrier (i.e., TiN or TiNO), and a metal layer (e.g., Al or W). There are three embodiments of the invention for forming the titanium silicide layer and two embodiments for forming the barrier layer (TiN or TiNO). The first embodiment for forming a TiSix layer comprises three selective deposition steps with varying TiCl4: SiH4 ratios. After the TiSix contact layer is formed a barrier layer and a metal plug layer are formed thereover to form a contact structure. The method comprises forming a barrier layer 140 over the silicide contact layer 126; and forming a metal plug 160 over the TiN barrier layer 140. The metal plug 160 is composed of Al or W.

9 Claims, 6 Drawing Sheets

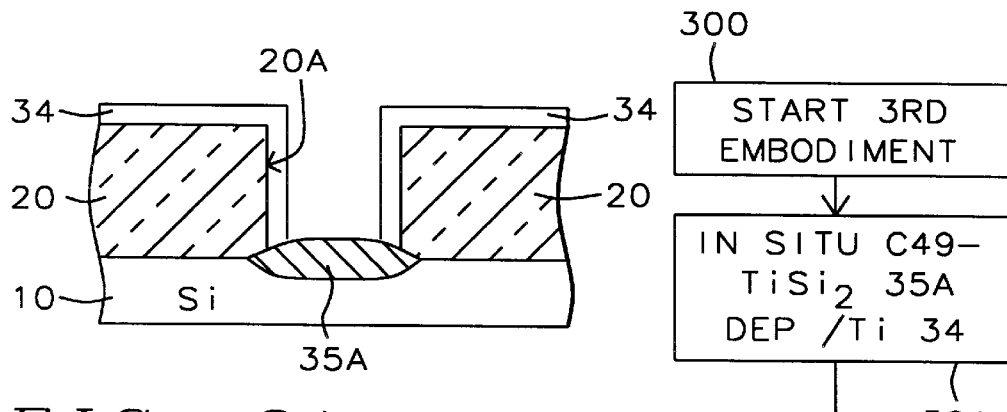
FIG. 3A
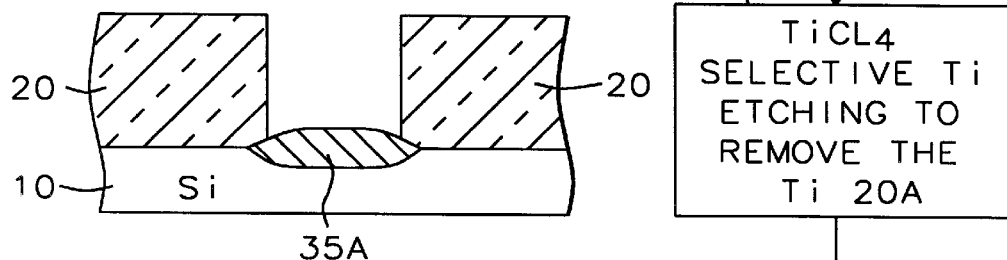
FIG. 3B
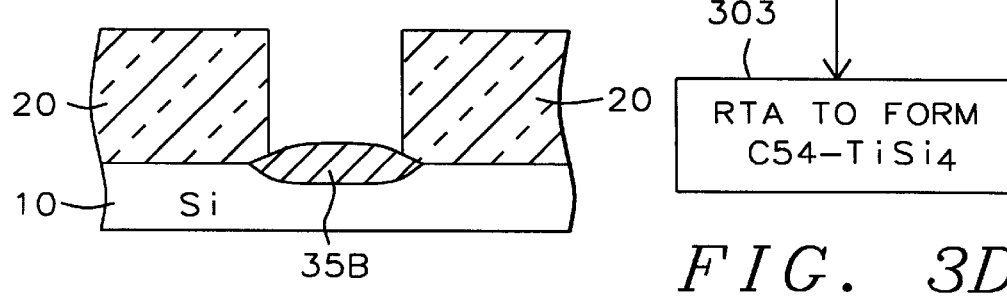
FIG. 3C
FIG. 3D

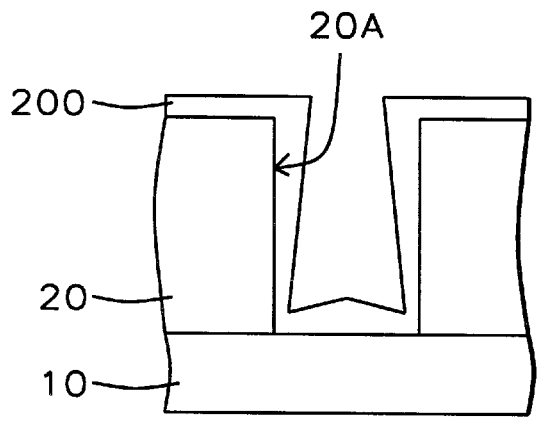
*FIG. 5A – Prior Art*
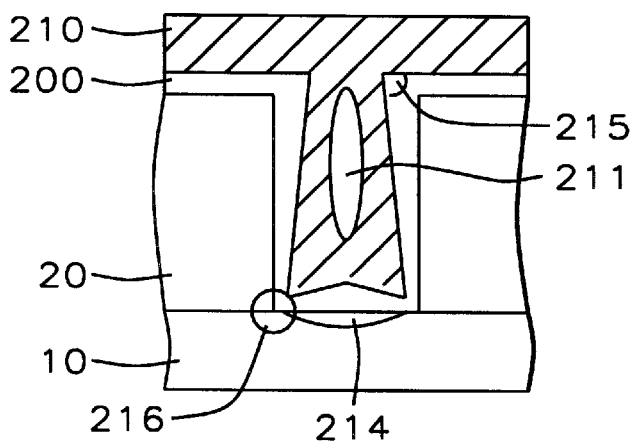
*FIG. 5B – Prior Art*
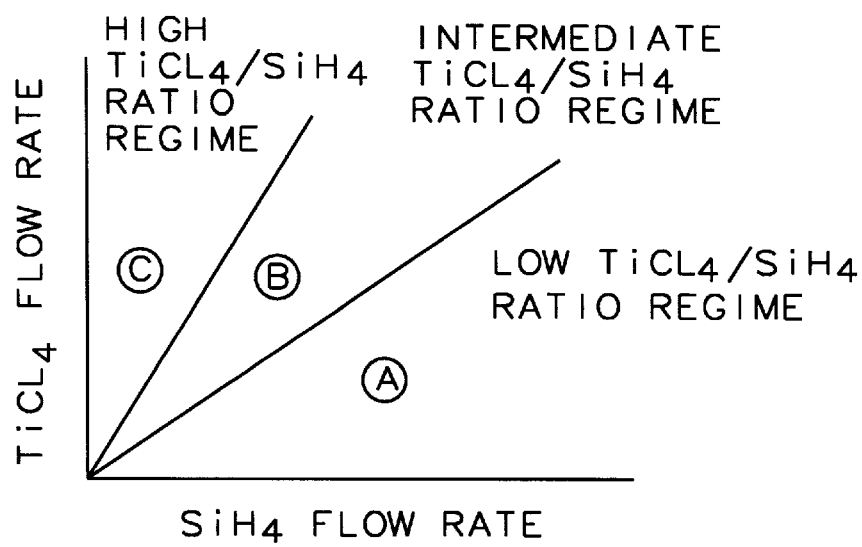
*FIG. 6*

INSITU FORMATION OF TISI₂/TIN BI-LAYER STRUCTURES USING SELF-ALIGNED NITRIDATION TREATMENT ON UNDERLYING CVD-TISI₂ LAYER

This is a division of patent application Ser. No. 08/954, 047, filing date Oct. 20, 1997, now U.S, Pat. No. 5,856,237 Insitu Formation Of Tisi2/Tin Bi-Layer Structures Using Self-Aligned Nitridation Treatment On Underlying Cvd-Tisi2 Layer, assigned to the same assignee as the present invention.

BACKGROUND OF THE INVENTION

1) Field of the Invention

This invention relates generally a semiconductor device and a method for manufacturing and more particularly to a structure of a MOS transistor having a metal silicide film formed on a source and a drain region and a method for manufacturing the MOS transistor and more particularly to a method for forming a metal silicide contact to a substrate and more specifically to a multilayered device metallization suitable for use in small geometry semiconductor devices and to methods for its fabrication.

2) Description of the Prior Art

There is a trend in the semiconductor industry toward fabricating larger and more complex functions on a given semiconductor chip. The larger and more complex functions are achieved by reducing device sizes and spacing and by reducing the junction depth of regions formed in the semiconductor substrate. Among the feature sizes which are reduced in size are the width and spacing of interconnecting metal lines and the contact openings through which the metalization makes electrical contact to device regions As the feature sizes are reduced, new problems arise which must be solved in order to economically and reliably produce the semiconductor devices.

As both the contact size and junction depth are reduced, a new device metallization process is required to overcome the problems which are encountered. Historically, device interconnections have been made with aluminum or aluminum alloy metallization. Aluminum, however, presents problems with junction spiking which result from dissolution of silicon in the aluminum metallization and aluminum in the silicon. This problem is exacerbated with the small device sizes because the shallow junction is easily shorted and because the amount of silicon available to satisfy the solubility requirements of the aluminum metallization is only accessed through the small contact area, increasing the resultant depth of the spike. Adding silicon to the aluminum metallization has helped to solve this problem, but has, in turn, resulted in silicon precipitation and other problems.

A variety of solutions have been attempted to overcome the problems inherent with aluminum metallization. For example, the device region exposed through a contact opening has been metallized with chemical vapor deposited (CVD) tungsten. The tungsten is deposited by the reduction of WF6 with hydrogen. The WF6, however, initially reacts with the silicon surface, employing silicon from the contact area in the region. This results in what has become known in the literature as "worm holes" or tunnels in the silicon which can also cause shorting of the underlying junction. The use of sputtered instead of CVD tungsten would overcome the problem of reaction with the silicon, but sputtered tungsten is unable to reduce any native oxide film which may be present on the surface of the device region. The remaining oxide film results in high contact resistance. A further attempt at solving this problem has employed the use of a reactive silicide to make the initial contact to the device region. The silicide is then contacted with aluminum. The suicide makes a low resistance contact to the silicon, but the silicide-aluminum contact has the same problem as does the use of aluminum directly on the silicon. Silicon from the suicide and from the underlying junction dissolves in the aluminum, resulting in aluminum spikes through the underlying junction.

Another problem which is exacerbated by the shrinking device sizes is that of unreliable step coverage by the device metallization as it traverses steps in the device topography and especially as the metallization traverses into the contact openings. It is therefore especially beneficial if the contact metallization provides a relatively planar surface to which the interconnect metallization can be applied.

As shown in FIG. 5A, a conventional method of forming a contact is by sputtering a Ti/TiN layer 200 over the isolation layer 20 sidewalls of a contact opening 20A and over a substrate surface. However the sputtered Ti/TiN layer 200 provides poor step coverage especially on the bottom.

As shown in FIG. 5B, the Ti/TiN layer 200 in the contact hole 20A takes up space and makes filling the contact hole 20A more difficult. The TiN layer 200 overhangs 215 the opening. This overhang 215 makes the void 211 problem in the metal plug 210 worse. Also, at the TiSix 214 at the bottom in incomplete thus causing high contact resistance and yield problems. At the corners, leakage 216 (Worm holes) also occur. $WF_6$ attacks the uncapped underlying Si to form worm holes 216 or insufficient corner coverage of TiN barrier results in formation of volatile $TiF_4$ gas and/or TiFx (x=1 to 3) higher resistance solid compound. The former $TiF_4$ will cause volcano formation and the latter (TiFx) leads to high resistance contacts.

The following U.S. patents show related processes and contact structures. U.S. Pat. No. 5.103,272 (Nishiyama) shows a TiSix layer and a TiN layer. The TiN layer is formed using an $N_2I/I$. U.S. Pat. No. 4,851,369(Ellwanger et al.) forming an interconnect comprising a TiSix covered by a W plug. U.S. Pat. No. 5,545,592(Lacoponi) shows a method of forming a contact using a TiSix and a TiN layer. U.S. Pat. No. 4,926,237(Sun et al.) shows a contact using TiSix, TiN and a W plug.

There still exist a need for an improved contact method and structure.

SUMMARY OF THE INVENTION

It is an object of the present invention to provide a method for fabricating a contact structure consisting of a silicon substrate, a titanium silicide layer, a barrier layer (TiN or TiNO layer), and a metal layer (e.g., Al or W).

It is an object of the present invention to provide a method for fabricating a contact structure consisting of a silicon substrate, a titanium silicide layer, a barrier layer (TiN or TiNO layer), and a metal layer (e.g., Al or W) wherein said titanium silicide layer is selectively deposited on the substrate surface.

It is another object of the present invention to provide a method for fabricating a contact structure consisting of a silicon substrate, a titanium silicide layer, a TiN barrier layer, and a metal layer (e.g., Al or W) wherein the TiN layer is formed by a self-aligned nitridation process.

It is another object of the present invention to provide a method for fabricating a contact structure consisting of a silicon substrate, a titanium silicide layer, a TiNO barrier layer, and a metal layer (e.g., Al or W) wherein the TiNO layer is formed by a nitration process using a N and O containing gas.

It is yet another object of the present invention to selectively form $TiSi_2$ on doped silicon regions and form TiN insitu so that the TiSix/TiN formation are performed in one reaction chamber.

It is yet another object of the present invention to form $TiSi_2$ and TiN over the doped Silicon areas and in salicided structures.

To accomplish the above objectives, the present invention provides a method of forming a contact structure comprising of: a silicon substrate, a titanium silicide layer, a barrier layer (i.e., TiN or TiNO), and a metal layer (e.g., Al or W). There are three embodiments of the invention for forming the titanium suicide layer and two embodiments for forming the barrier layer.

The first embodiment for forming selectively depositing a TiSix layer comprising the steps of:
a) FIG. 1A forming first insulating layer 20 having a contact opening 20A on a substrate 10;
b) FIG. 1A—insitu clean the substrate 10 using of a gas selected from the group consisting of $SiH_4$ and $H_2$ for plasmaless cleaning or conventional dep dual frequency Ar or Ar/$H_2$ soft sputter etch cleaning;
c) FIG. 1B selectively depositing a first titanium silicide ($TiSi_2$) layer 30A at a lower $TiCl4/SiH_4$ flow ratio;
d) FIG. 1C—selectively depositing a second titanium silicide ($TiSi_2$) layer 30B at a higher $TiCl4/SiH_4$ flow;
e) FIG. 1D—selectively depositing a third titanium silicide $TiSi_2$ layer 30C at an intermediate $TiCl4/SiH_4$ flow and using a chloride containing gas of a material selected from the group consisting of HCL and ClF3; the first, second, and third titanium silicide layers forming a Titanium silicide contact layer 30.

The second embodiment for forming selectively depositing a TiSix layer comprising the steps of:
a) FIG. 2A forming first insulating layer 20 having a contact opening 20A on a substrate 10;
b) FIG. 2A insitu cleaning the substrate using of a gas selected from the group consisting of SiH4 and $H_2$;
c) FIG. 2B step 2—selectively depositing a silicon layer 40 over the substrate in the contact opening;
d) FIG. 2C step 3—etching the silicon epitaxial layer using a gas of a material selected from the group consisting of HCL, $ClF_3$, $C_2F_6$ and SiF4;
e) FIG. 2D Step 4—selectively depositing a first titanium silicide ($TiSi_2$) layer 32A over the Si silicon epitaxial layer in the contact opening;
f) Step 5—selectively depositing second titanium silicide ($TiSi_2$) layer 32B over the first titanium silicide layer 32A using a selective deposition process with an intermediate TiCl4/$SiH_4$ flow ratio and using a chloride containing gas of a material selected from the group consisting of HCL and ClF3; the first and second titanium silicide layers forming a titanium silicide contact layer.

The third embodiment for forming selectively depositing a TiSix layer comprising the steps of:
a) FIG. 3A—forming first insulating layer 20 having a contact opening 20A on a substrate;
b) insitu cleaning the substrate 10 using of a gas selected from the group consisting of SiH4 and $H_2$;
c) insitu depositing a first $TiSi_x$/Ti layer 34 35A over the first insulating layer 20 and the substrate 10 using a plasma enhanced chemical vapor deposition process at a temperature less than 600 ° C. using TiCl4 and $H_2$ gasses;
d) FIG. 3B etching the Ti layer 34 using a TiCl4 plasma to remove the Ti layer 34 over the first insulating layer 20; the TiSix layer 35A composed of C49-TiSix;
e) FIG. 3C—rapid thermal annealing the first $TiSi_2$/Ti layer 35A forming a Titanium silicide contact layer 35B over the substrate in the contact opening;
the Titanium silicide contact layer 35B composed of C54-TiSix.

The three embodiments for forming the Titanium silicide contact layer has many advantages over the conventional TiSix processes.

(1) Because the TiSix layer is selectively deposited on the contact area, a wet etch is eliminated and 2 RTP steps are eliminated. The first RTP forms C49-$TiSi_2$ and wet etch to remove unreacted Ti. This is followed with a second RTP to form C54-$TiS_2$. But the invention's direct CVD $TiSi_2$ can selectively form C54 $TiSi_2$.

(2) Direct C-54 $TiSi_2$ formation with bridging problems common with blanket Ti depositions and etch back processes.

(3) Relatively low thermal budget minimizes the dopant redistribution and suppress the agglomeration occurrence.

(4) Low cost of ownership—The invention eliminates the two RTP steps, 1 wet etch steps of the previous salicide process and also the TiN deposition step.

After the TiSix contact layer is formed over the substrate preferably using one of the above three embodiments, a barrier layer and a metal plug layer are formed thereover to form a contact structure. The method of forming a contact structure (composed of a Titanium slicide layer /(TiN or TiNO)bilayer) for contacting a substrate of a semiconductor device; comprising the steps of:
a) FIG. 4A forming a titanium silicide contact layer 126 on the substrate in the contact opening;
b) forming a barrier layer 140 over the silicide contact layer 126;
c) forming a metal plug 160 over the TiN barrier layer 140; the metal plug 160 composed of a material selected from the group consisting of Al and W.

In the fourth embodiment of the invention, the barrier layer is composed of TiN and the barrier layer is formed using a self-aligned nitridation treatment performed insitu using a nitrogen containing gas of N2 or $NH_3$, using a plasma process.

In the fifth embodiment of the invention, the barrier layer composed of Ti—N—O and the barrier layer is formed using a of a process selected from the group consisting of (1) nitridation in a nitrogen and oxygen containing ambient and (2) a two step nitridation and oxidation treatment.

The present invention has a novel in-situ and self-aligned nitridation on $TiSi_2$ top surface to produce an insitu $TiSi_2$/TiN bi-layer selective deposition. Furthermore, the $TiSi_2$/TiN bi-layer can cover entirely the diffusion regions as well as poly-gate to form low resistant self-aligned silicide barrier structure.

The invention provide the following benefits.

(1) The invention reduces the number of process steps by performing the in-situ nitridation treatment on TiSi2 just after the selective $TiSi_2$ CVD process step via plasma nitridation or RTN to combine the salicide and TiN deposition process steps.

(2) The process of the invention eliminates the poor step coverage problem caused by TiN deposition.

(3) The $TiSi_2$/TiN is sequentially formed in one chamber under vacuum, suppresses the contamination path and protects the $TiSi_2$.

(4) $TiSi_2$/TiN is formed before the dielectric deposition, the Tin aye can improve the $TiSi_2$ thermal stability and reduce the contact RIE damage.

BRIEF DESCRIPTION OF THE DRAWINGS

The features and advantages of a semiconductor device according to the present invention and further details of a process of fabricating such a semiconductor device in accordance with the present invention will be more clearly understood from the following description taken in conjunction with the accompanying drawings in which like reference numerals designate similar or corresponding elements, regions and portions and in which:

FIGS. 3A through 3D are cross sectional views for illustrating a third embodiment for forming the titanium silicide layer according to the present invention.

FIGS. 5A and 5B are cross sectional views for illustrating a contact structure according to the prior art.

FIG. 6 is a graph of showing the three SiCl3 to $SiH_4$ flow ratio regimes (A, B and C) of the present invention.

DETAILED DESCRIPTION OF THE PREFERRED EMBODIMENTS

Figure 1A:
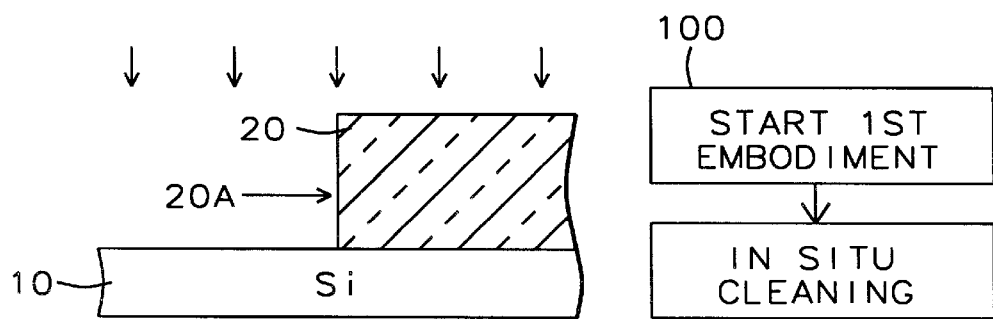
FIGS. 1A through 1E are cross sectional views for illustrating a first embodiment for form the titanium silicide layer according to the present invention.

The present invention will be described in detail with reference to the accompanying drawings. The present invention provides a method of forming a contact structure comprising a silicon surface (e.g., substrate or gate), a titanium silicide layer, a barrier layer (i.e., TiN or TiNO), and a metal layer (e.g., Al or W). There are three embodiments of the invention for forming the titanium silicide layer and two embodiments for forming the barrier layer which are disclosed below. See table 1 below:

TABLE 1

Overview of the Invention - Embodiments Of The Invention
OVERVIEW OF THE INVENTION SELECTIVE $TiSi_2$ FORMATION
3 Embodiments

| (1) 3 step TiSix Selective deposition- FIGS. 1A to 1D | (2) Selective Si Growth with Etch back and TiSix Selective Dep FIGS. 2A to 2E | (3) Ti Dep/Plasma Etch/RTA FIGS. 4A to 4F |
|---|---|---|

BARRIER LAYER FORMATION
2 Embodiments -
See FIGS. 4A to 4F.

| (4) TiN barrier layer | (5) TiNO barrier layer |
|---|---|

METAL PLUG FORMATION
Al or W plug

The following information applies to all three embodiments for forming the TiSix layer. The TiSix deposition processes for the first three embodiments use varying ratios of reactant gasses to form TiSx layer that are either, deposit Si (Regime A), not deposit Si (Regime B), or consume Silicon (Regime C). FIG. 6 the tables below explain this process.

FIG. 6 shows a graph of the TiCl4 flow rates vs $SiH_4$ flow rates.

As shown in FIG. 6, the slopes of lines L1 and L2 are dependent on various process parameters like temperature, pressure, plasma (on or off). The deposition processes for steps 2 through 4 (for all three embodiments) can be RTCVD, low pressure chemical vapor deposition (LPCVD), or plasma enhanced chemical vapor deposition (PECVD).

TABLE 3

Regimes of TiCl4 to $SiH_4$ flow ratios shown in FIG. 6

| | |
|---|---|
| Regime A | represents the TiCl4 to $SiH_4$ flow ratios that $TiSi_2$ will selectively deposit with the underlying Si layer. |
| Regime B | represents the optimal regime between regime A and C. In Regime C, $TiSi_2$ can selectively deposit and consume the Si approximately equal to the is supplied from the SiH4 (or $SiH_2Cl_2$) decomposition. |
| Regime C | represents the $TiCl_4$ to $SiH_4$ flow ratios that $TiSi_2$ will selectively deposit without the Si layer and will consume more Si (from under the $TiSi_2$ layer) rather than the Si supplied by $SiH_4$ decomposition. |

TABLE

Preferred Flow ratios for the 3 regimes - for all Three embodiments

| Part 1- 1st embodiment - selective TiSix contact layer formation | Low Temp (C °) | Tgt Temp (C °) | Hi temp (C °) | Low Press (mtorr) | tgt Press (mtorr) | Hi Press (mtorr) | Low flow ratio | Tgt flow TiCl4/SiH4 ratio | Hi flow |
|---|---|---|---|---|---|---|---|---|---|
| lower TiCl4/$SiH_4$ flow ratio - Regime A | 500 | 700 | 1000 | 50 mtorr | 2 torr | 50 torr | 0.005 | 0.01 | 0.08 |
| intermediate TiCl4/$SiH_4$ flow ratio - Regime B | 500 | 700 | 1000 | 50 mtorr | 2 torr | 50 torr | 0.08 | 0.1 | 0.02 |
| higher TiCl4/$SiH_4$ flow ratio - Regime C | 500 | 700 | 1000 | 50 mtorr | 2 torr | 50 torr | 0.2 | 0.05 | 10 |

The three regimes (A, B and C) apply to all three embodiments of the invention. In addition the reactant gasses can be either $TiCl_4$/$SiH_4$ or $TiCl_4$/$SiH_2Cl_2$.

II. First Embodiment for Forming Selectively Depositing a TiSix Layer

The table below summarized the important steps and low/high process parameters for the first embodiment. See FIGS. 2A–2E.

TABLE 2

1st Embodiment - Summary Of Steps And Preferred Process Limits

| Part 1- 1st embodiment selective TiSix contact layer formation | Low Temp (C °) | Tgt Temp (C °) | Hi temp (C °) | Low Press (mtorr) | tgt Press (mtorr) | Hi Press (mtorr) | Low flow ratio | Tgt flow TiCl4/SiH4 ratio | Hi flow |
|---|---|---|---|---|---|---|---|---|---|
| Step 1- insitu clean - $SiH_4$ | 650 | 720 | 750 | 0.1 mtorr | 1 mtorr | 5 mtorr | 0 | 0 | 0 |
| step 2- 1st $TiSi_2$ selective deposition - lower TiCl4/$SiH_4$ flow ratio - Regime A | 500 | 700 | 1000 | 50 mtorr | 2 torr | 50 torr | 0.005 | 0.01 | 0.08 |
| step 3- 2nd TiSi2 selective deposition - higher TiCl4/$SiH_4$ flow | 500 | 700 | 1000 | 50 mtorr | 2 torr | 50 torr | 0.2 | 0.05 | 10 |

TABLE 2-continued

1st Embodiment - Summary Of Steps And Preferred Process Limits

| Part 1- 1st embodiment selective TiSix contact layer formation | Low Temp (C °) | Tgt Temp (C °) | Hi temp (C °) | Low Press (mtorr) | tgt Press (mtorr) | Hi Press (mtorr) | Low flow ratio | Tgt flow TiCl4/SiH4 ratio | Hi flow |
|---|---|---|---|---|---|---|---|---|---|
| ratio - Regime C | | | | | | | | | |
| Step 4- 3rd TiSi$_2$ selective deposition - intermediate TiCl4/SiH$_4$ flow ratio - Regime B | 500 | 700 | 1000 | 50 mtorr | 2 torr | 50 torr | 0.08 | 0.1 | 0.02 |

For the first embodiments (See table above) steps 1 though 4 are preferably preformed at a pressure between about 0 and 10 torr and at a temperature between about 400 and 800° C.

The first embodiment for selectively depositing a TiSix layer is shown and described in FIGS. 1A to 1D. As shown in FIG. 1A, first insulating layer 20 having a contact opening 20A is formed on a substrate 10. Substrate 10 is understood to possibly include a semiconductor wafer, active and passive devices formed within the wafer and layers formed on the wafer surface. The term "substrate" is mean to include devices formed within a semiconductor wafer and the layers overlying the wafer. The term "substrate surface" is meant to include the upper most exposed layers on a semiconductor wafer, such as a silicon surface, an insulating layer and metallurgy lines.

The first insulating layer 20 can be formed on any insulating material including silicon oxide, silicon oxynitride and silicon nitride and any combination of insulative layers. The contact opening an be over the substrate, gate structure or any other device.

Next, still referring to FIG. 1A, the substrate is preferably insitu cleaned using of a gas selected from the group consisting of SiH4 and H$_2$.

Figure 1B:
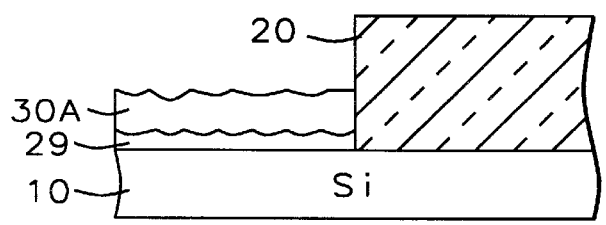

Turning to FIG. 1B, a selectively deposited silicon layer 29 and a first titanium silicide (TiSi$_2$) layer 30A are deposited at a lower TiCl4/SiH$_4$ flow ratio—Regime A. The silicon layer 29 is co-deposited under the TiSi$_2$ layer 30A. See the table above for preferred parameter limits. The deposition processes for steps 2 through 4 (for all three embodiments) can be RTCVD, low pressure chemical vapor deposition (LPCVD), or plasma enhanced chemical vapor deposition (PECVD).

Figure 1C:
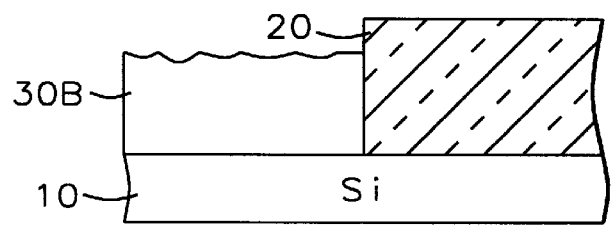

Referring to FIG. 1C, a second titanium silicide (TiSi$_2$) layer 30B selectively deposited at a higher TiCl4/SiH$_4$ flow ratio (Regime C) as shown in the table above. This higher ratio provides higher selectivity. The silicon layer 29 beneath the TiSi$_2$ layer 30B is consumed by this second TiSi$_2$ deposition step. The silicon layer 29 beneath the TiSi$_2$ layer 30B prevents the undesirable consumption of the substrate by this second TiSi$_2$ deposition step.

Figure 1D:
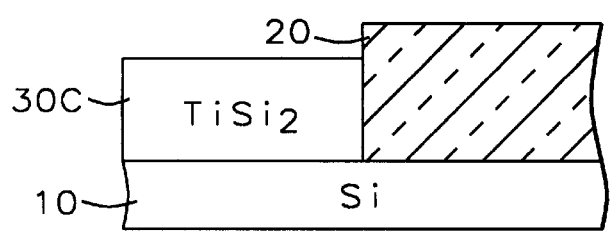
Figure 1E:
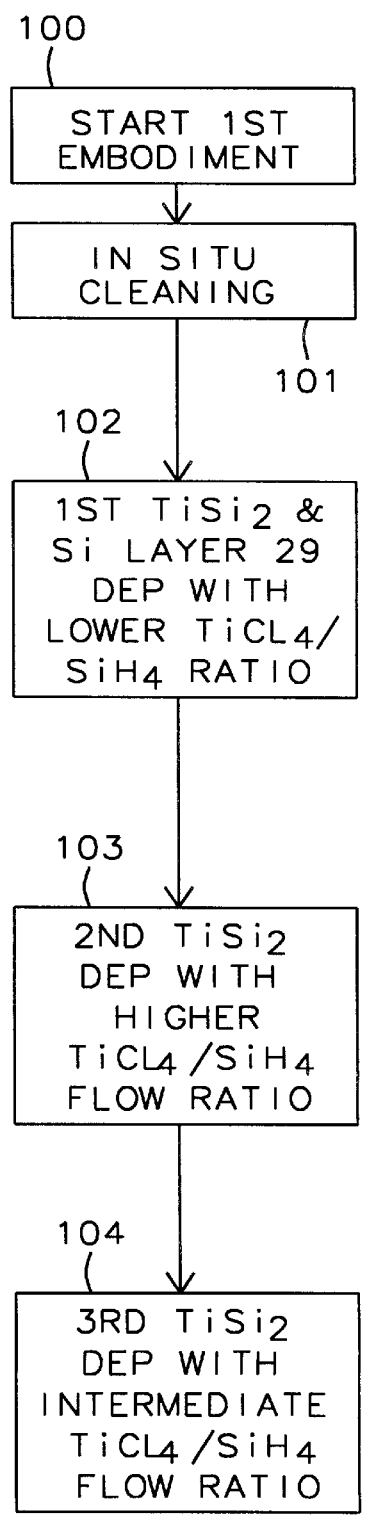

As shown in FIG. 1D, a third titanium silicide TiSi$_2$ layer 30C is selectively depositing at an intermediate TiCl4/SiH$_4$ flow ratio as shown in the table above using a chloride containing gas of a material selected from the group consisting of HCL and ClF3. This maintains the selectivity and provides a smooth TiSi$_2$ surface. This step also improves the loading effect in selective deposition.

The first, second, and third titanium silicide layers make up a Titanium silicide contact layer 30C.

III. Second Embodiment for Forming Selectively Depositing a TiSix Layer 32

The second embodiment for selectively depositing a TiSix layer is shown and described in FIGS. 2A to 2E. As shown in FIG. 1A, first insulating layer 20 having a contact opening 20A is formed on a substrate 10.

TABLE

Embodiment 2 - Summary Of Steps And Preferred Process Limits

| Embodiment 2 - selective TiSix contact layer formation | Low Temp (C °) | Tgt Temp (C °) | Hi temp (C °) | Low Press | tgt Press | High Press | Low gas flow | Tgt gas flow ratio | Hi gas flow |
|---|---|---|---|---|---|---|---|---|---|
| Step 1- insitu clean (SiH$_4$) | 650 | 720 | 750 | 0.1 mtorr | 1 mtorr | 5 mtorr | 0 | 0 | 0 |
| step 2- Si Selective deposition layer 40 SiH$_4$ or SiH2Cl$_2$ gas | 400 | 700 | 1000 | 1 torr | 1.8 torr | 100 torr | SiH$_4$ or SiH$_2$Cl$_2$ 10 sccm | SiH4 or SiH$_2$Cl$_2$ 80 sccm | SiH4 or SiH2$_{Cl2}$ 100 sccm |
| step 3- Etch Si on oxide/nitride surface with HCl or ClF$_3$ | 600 | 700 | 800 | 50 mtorr | 2 torr | 50 torr | | | |
| Step 4- 1st TiSi$_2$ selective deposition - low TiCl4/SiH$_4$ flow ratio - Regime A | 500 | 700 | 1000 | 50 mtorr | 2 torr | 50 torr | TiCl4/ SiH4 ratio 0.2 | TiCl4/ SiH4 ratio 0.5 | TiCl4/ SiH4 ratio 10 |

TABLE-continued

Embodiment 2 - Summary Of Steps And Preferred Process Limits

| Embodiment 2 - selective TiSix contact layer formation | Low Temp (C °) | Tgt Temp (C °) | Hi temp (C °) | Low Press | tgt Press | High Press | Low gas flow | Tgt gas flow ratio | Hi gas flow |
|---|---|---|---|---|---|---|---|---|---|
| Step 5- 1st TiSi$_2$ selective deposition - intermediate TiCl4/SiH$_4$ flow ratio - Regime B | 500 | 700 | 1000 | 50 | 2 torr | 50 torr | TiCl4/ SiH4 ratio = 0.01 | TiCl4/ SiH4 ratio = 0.1 | TiCl4/ SiH4 ratio = 0.2 |

Figure 2A:
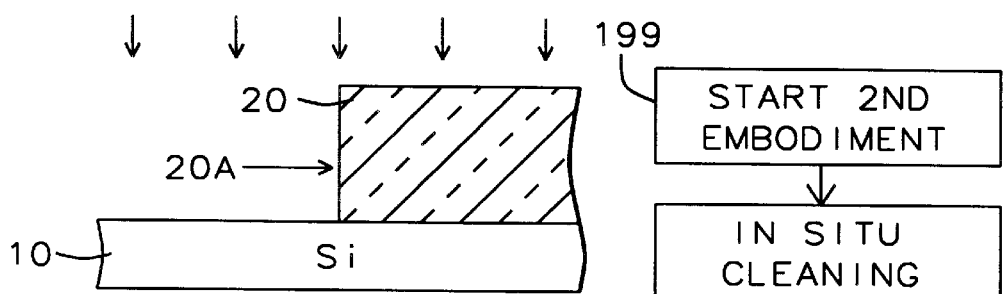
FIGS. 2A through 2F are cross sectional views for illustrating a first embodiment for form the titanium silicide layer according to the present invention.

As shown in FIG. 2A, a first insulating layer 20 having a contact opening 20A is formed on a substrate 10. Next, the substrate is preferably cleaned using of a gas selected from the group consisting of SiH4 and H$_2$.

Figure 2B:
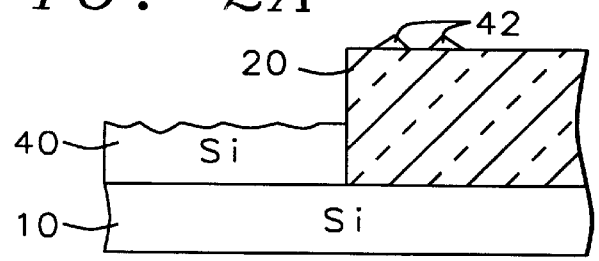

As shown in FIG. 2B, (step 2-) a silicon layer 40 is selectively deposited over the substrate 10 in the contact opening 20A. The silicon layer 40 preferably has a thickness in a range of between about 50 and 500 Å. The silicon layer 40 can be an epitaxial layer. The deposition can also form Si particles 42 on the insulating layer 20.

Figure 2C:
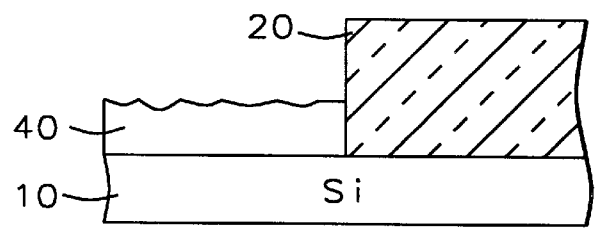

As shown in FIG. 2C (step 3) the Si nuclei 42 on the oxide/nitride surface 20 formed by the selectivity loss in the Si selective deposition (step 2) are etched away by using a gas off HCL, ClF$_3$, C$_2$F$_6$ or SiF4. The etch will not significantly attack the Si layer 40 due to the robust Si crystal structure. This etch step guarantee's the selectivity of the Silicon deposition on the Si surfaces and not on the insulating layer.

Figure 2D:
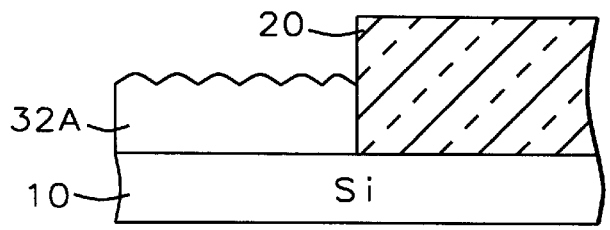

As shown in FIG. 2D, ( Step 4) a first titanium silicide (TiSi$_2$ ) layer 32A is selectively deposited over the Si silicon layer 40 in the contact opening. The first titanium silicide (TiSi$_2$) layer 32A is preferably deposited with a high TiCl4 To SiH$_4$ (or SiH$_2$Cl$_2$) flow ratio (Regime C). The first titanium silicide (TiSi$_2$) layer 32A preferably has a thickness in a range of between about 50 and 600 Å.

The TiSix layer 32A consumes the Silicon layer 40 because of the low flow ratio (regime a).

Figure 2E:
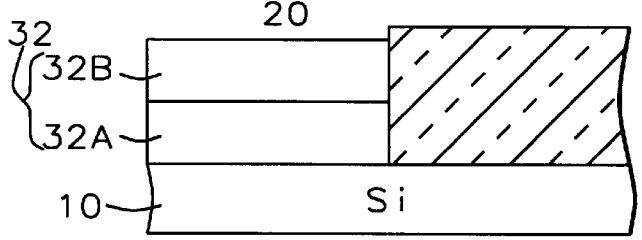
Figure 2F:
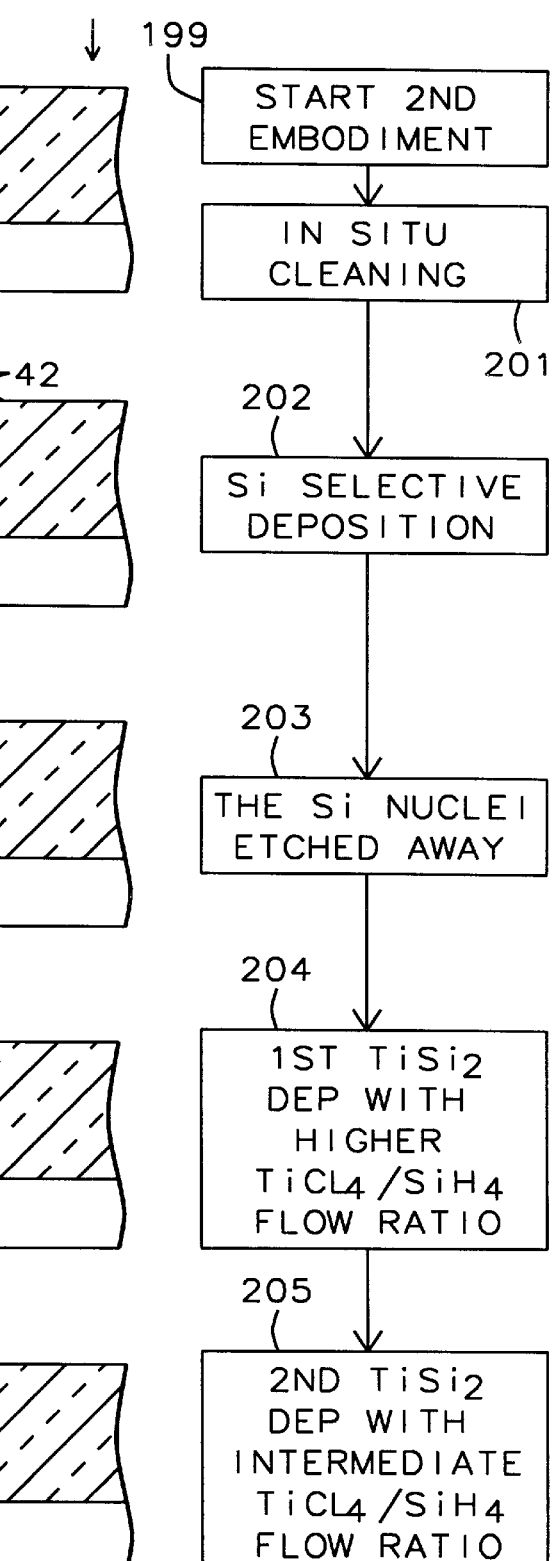

As shown in FIG. 2E, (Step 5) a second titanium silicide (TiSi$_2$) layer 32B is selectively deposited over the first titanium silicide layer 32A using a selective deposition process with an intermediate TiCl4/SiH$_4$ flow ratio (Regime B). The process also preferably uses a chloride containing gas of a material selected from the group consisting of HCL and ClF$_3$. These HCL and ClF$_3$ gases maintain the selectivity and smooth the final TiSi$_2$ surface 32B. The first 32A and second titanium silicide layers 32B form a titanium silicide contact layer 32.

IV. Third Embodiment for Forming Selectively Depositing a TiSix Layer

The third embodiment for forming selectively depositing a TiSix layer begins by forming first insulating layer 20 having a contact opening 20A on a substrate as shown in FIG. 3A.

The substrate 10 is insitu cleaned using of a gas selected from the group consisting of SiH4 and H$_2$.

A first TiSi$_x$ layer 35A and a Ti layer 34 is insitu deposited over the first insulating layer 20 and the substrate 10 using a plasma enhanced chemical vapor deposition process at a temperature less than 600 ° C. using TiCl4 and H$_2$ gasses. The first C49-TiSi$_2$ layer 35A is formed on the substrate 10 surface. The Ti layer 34 is formed over the insulating layer 20.

As shown in FIG. 3B, the Ti layer 34 is etched preferably using TiCl$_4$ to remove the Ti layer 34 over the first insulating layer 20. The TiCl$_4$ does not significantly etch the TiSi$_2$ layer 35A. The TiSix layer 35A composed of C49-TiSi$_2$. See table above for process parameters. The C49-TiSi$_2$ layer is deposited at a lower temperature, has a much lower etch rate in TiCl$_4$ compared to pure Ti, and has smaller grains of C49 compared to C54 so can obtain a smoother surface. (C49 resistivity=60 to 12 $\mu$ ohms-cm vs C54 resistivity=12 to 20 $\mu$ ohms-cm.

As shown in FIG. 3C, the first TiSi$_2$ layer is rapid thermal annealed (RTA) forming a titanium silicide contact layer 35B over the substrate in the contact opening. The Titanium silicide contact layer 35B is now composed of C54-TiSix. The C54-TiSi2 layer 35B has a significantly lower resistivity.

TABLE

Embodiment 3 - Summary of steps and process Limits

| Embodiment 3 | Low Temp | Tgt Temp | Hi temp | Low Press | tgt Press | Hi Pres sure | Lo flow ratio | Tgt flow | Hi flow |
|---|---|---|---|---|---|---|---|---|---|
| Step 1- insitu TiSix/TiPECVD dep | 350 | 570 | 650 | 1 torr | 5 torr | 20 torr | | TiCl$_4$ /H2 | |
| step 2-TiC4 Plasma Selective Ti Etch | 300 | 570 | 750 | 1 torr | 5 torr | 20 torr | 1 sccm TiCl$_4$ | 3 sccm TiCl$_4$ | 50 sccm TiCl$_4$ |
| step 3- RTA to form C54-TiSi$_2$ | 600 | 750 | 950 | | | | | | |

V. Part 2—Salicide Process—a Barrier Layer and a Metal Plug are Formed Over The TiSix Contact Layer After the TiSix contact layer is formed over the substrate preferably using one or the above three embodiments, a barrier layer and a metal plug layer are formed thereover to form a contact structure. The invention has 2 preferred embodiments (4 and 5) for forming the barrier layer. See FIGS. 4A through 4F.

Figure 4A:
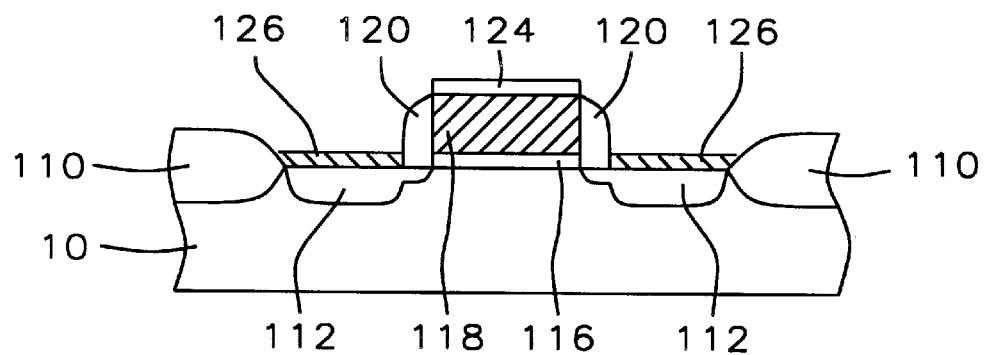
FIGS. 4A through 4F are cross sectional views for illustrating the 4th and 5th embodiments for forming the Barrier layer and plug over a titanium silicide layer according to the present invention.

As shown in FIG. 4A, isolation regions 110, gate oxide layer 116, gate structures 118 (e.g., polysilicon), sidewall spacers 120, and doped source and drain regions 112 are formed on a substrate surface 10.

A titanium silicide contact layer 126 is formed on the substrate in the contact opening on the exposed substrate and polysilicon gate 118 surfaces. The TiSix contact layer 126 is formed over the substrate preferably using one of the above three embodiments. The $TiSi_2$ layer is either selectively or blank deposition on the S/D and gate regions using PE-CVD or RT-CVD.

Figure 4B:
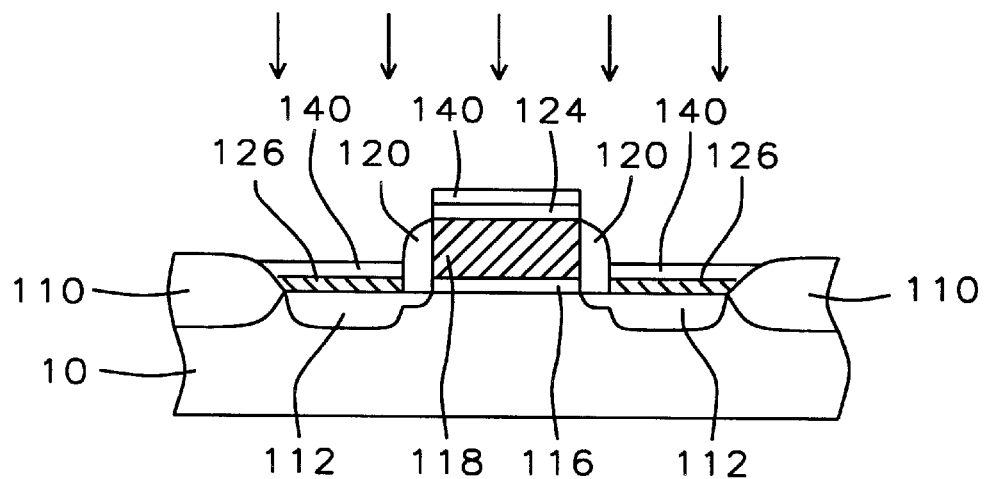

As shown in FIG. 4B, a barrier layer 140 is now formed over the silicide contact layer 126. The barrier layer is preferably formed of TiN or Ti—N—O.

In the fourth preferred embodiment, the barrier layer is composed of TiN. The barrier layer is formed using a self-aligned nitridation treatment performed insitu using a nitrogen containing gas of a material selected from the group consisting of N2 or NH3, using a plasma process (PECVD).

In the fifth preferred embodiment, the barrier layer is composed of Ti—N—O. The barrier layer is formed using a of a process selected from the group consisting of (1) RTA-CVD nitridation in a nitrogen ($N_2$) and oxygen ($O_2$) containing ambient and (2) RTA a two step nitridation and oxidation treatment.

Figure 4C:
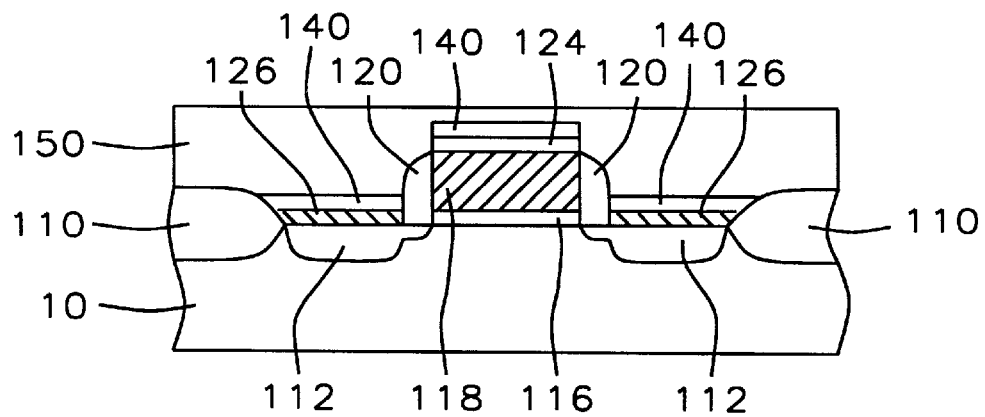

As shown in FIG. 4C, a dielectric (IDL1—inter dielectric layer 1) layer 150 is formed over the substrate surface. Simultaneously, the TiN/TiSix layers 126 and 140 are annealed.

Figure 4D:
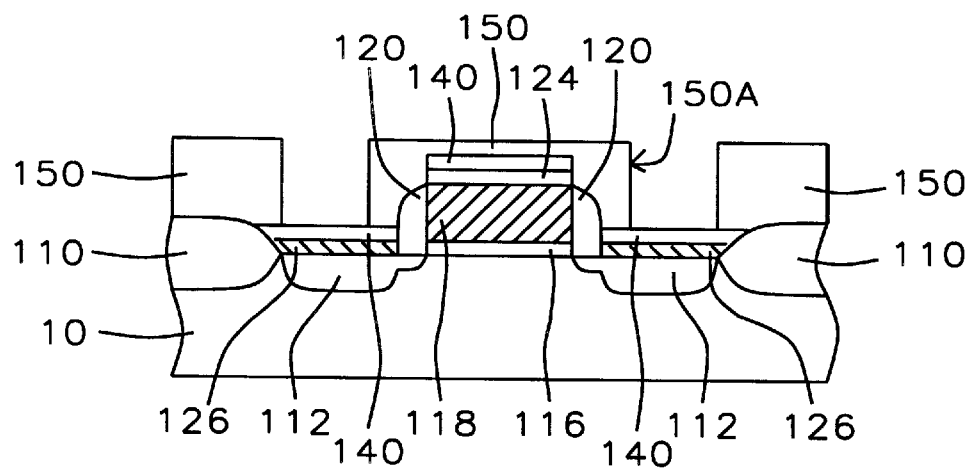

As shown in FIG. 4D, a contact hole 150A is formed exposing the TiN/TiSix layers 126 140.

Figure 4E:
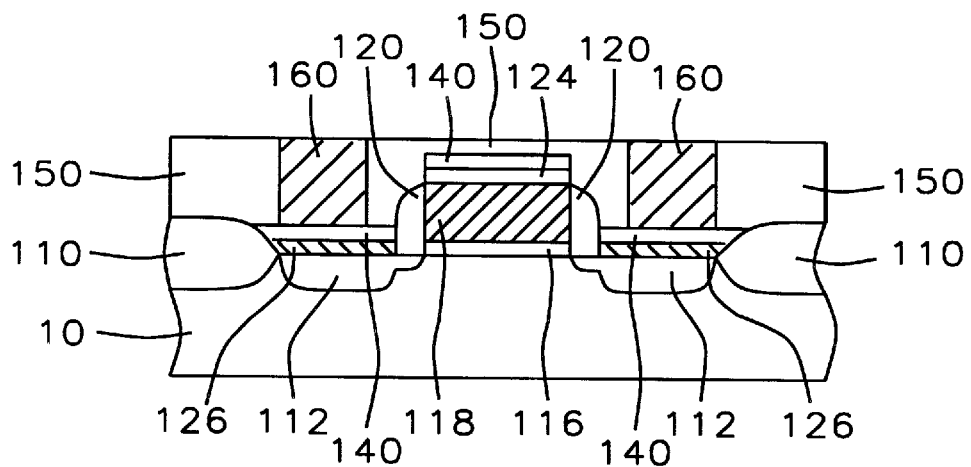

As shown in FIG. 4E-1, a metal plug 160 is formed over the TiN barrier layer 140. The metal plug 160 composed of a material selected from the group consisting of Al and W.

Figure 4F:
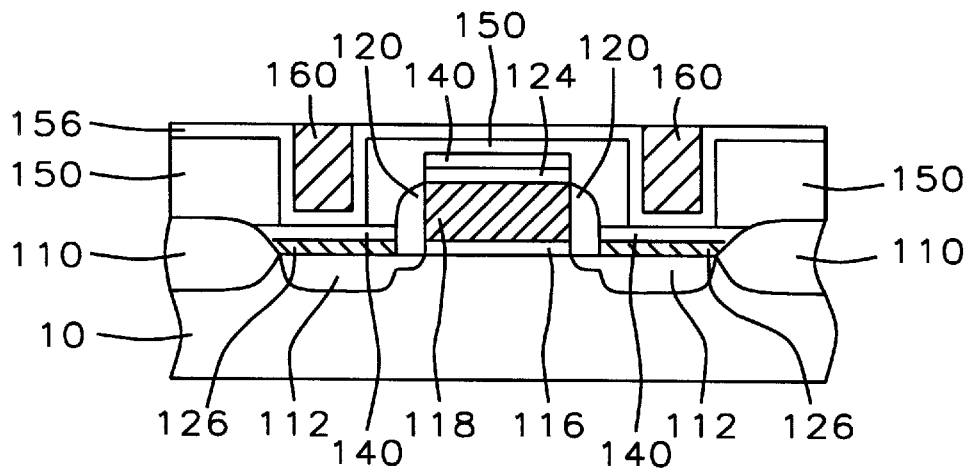

Alternately, as shown in FIG. 4F, a TiN liner 156 can over the IDL layer 150. A W or Al plug 160 can be formed in the contact hole 150A.

The invention's self-aligned Barrier layer has many advantages over Conventional Processes. The invention provides a simplified integration process for TiSi2/TiN in situ formation. The invention's TiSi2/TiN depositions can be performed in situ in one reactor to increase throughput. The invention's TiSi2/TiN depositions do not have the conventional step-coverage problems. The invention can be used with an ultra-thin or without liner/glue-layer to reduce the difficulties of following plug-filling into high aspect-ratio features. The invention allows the use of thicker TiN film to resist contact RIE overetch in salicide process. The invention Post-anneals the TiSix/TiN layers in situ in the following ILD deposition. The eliminates a Post anneal step. The invention's in situ TiN formation can be acted as protection cap to prevent oxidation or contamination on underlying TiSi2 layer.

In the above description numerous specific details are set forth such as flow rates, pressure settings, thicknesses, etc., in order to provide a more thorough understanding of the present invention. It will be obvious, however, to one skilled in the art that the present invention may be practiced without these details. In other instances, well know process have not be described in detail in order to not unnecessarily obscure the present invention.

While the invention has been particularly shown and described with reference to the preferred embodiments thereof, it will be understood by those skilled in the art that various changes in form and details may be made without departing from the spirit and scope of the invention.

What is claimed is:

1. A method of forming a titanium silicide contact on a substrate; comprising the steps of:
    a) forming first insulating layer having a contact opening on a substrate;
    b) insitu depositing a first $C49-TiSi_2$ layer over said substrate and depositing a Ti layer over said first insulating layer;
    c) etching said Ti layer to remove said Ti layer over said first insulating layer;
    d) rapid thermal annealing said first $C49-TiSi_2$ layer forming a titanium contact layer over said substrate in said contact opening; said Titanium silicide contact layer composed of $C54-TiSi_2$.

2. The method of claim 1 wherein step (b) includes using a plasma enhanced chemical vapor deposition process at a temperature less than 600 ° C. using TiCl4 and $H_2$ gasses.

3. The method of claim 1 wherein step (c) is preformed using a $TiCl_4$ plasma at a temperature between 300 and 750° C., a pressure between 1 torr and 20 torr and a $TiCl_4$ flow between 1 sccm and 50 sccm.

4. The method of claim 1 wherein step (d) is performed at temperature between 600 and 950° C.

5. A method of forming a contact structure composed of a Titanium silicide layer/TiN bi-layer for contacting a substrate of a semiconductor device; comprising the steps of
    a) forming a titanium silicide contact layer on said substrate in said contact opening; said first insulating layer formed in a chamber;
    b) forming a barrier layer over said silicide contact layer; said barrier layer is composed of TiN and said barrier layer is formed using a self-aligned nitridation treatment performed insitu using a nitrogen containing gas of a material selected from the group consisting of $N_2$ or NH3, using a plasma process; steps (a) and (b) are performed sequentially in said chamber;
    c) forming a metal plug over said TiN barrier layer ; said metal plug composed of a material selected from the group consisting of Al and W.

6. The method of claim 5 wherein said titanium silicide contact layer is formed by
    a) providing a first insulating layer having a contact opening over a substrate;
    b) simultaneously selectively depositing a silicon layer and an overlying first titanium silicide layer at a low $TiCl_4$ to Si containing gas flow ratio between about 0.05 to 0.08;
    c) selectively depositing a second titanium silicide layer over said first titanium silicide layer so that said second titanium silicide layer consumes said silicon layer; said second titanium silicide layer formed at a high $TiCl_4$ to Si containing gas flow ratio between about 0.2 and 10, whereby the high $TiCl_4$ to Si containing gas flow ratio causes said second titanium silicide layer to consume said silicon layer;
    d) selectively depositing a third titanium silicide $TiSi_2$ layer over said second titanium silicide layer at an intermediate TiCl4 to Si containing gas flow ratio between about 0.08 and 0.2 and using a chloride containing gas of a material selected from the group consisting of HCL and ClF$_3$; said first, second, and third titanium silicide layers forming a titanium silicide contact layer.

7. So the method of claim 5 wherein said titanium silicide contact layer is formed by
 a) forming first insulating layer having a contact opening over a substrate;
 b) selectively depositing a silicon layer over said substrate in said contact opening;
 c) etching said silicon layer using a gas of a material selected from the group consisting of HCL, ClF$_3$, C$_2$F$_6$ and SiF$_4$;
 d) selectively depositing a first titanium silicide layer over said silicon layer in said contact opening; said first titanium silicide layer deposited with an intermediate TiCl4 to Si containing gas flow ratio between about 0.2 and 10;
 e) selectively depositing a second titanium silicide layer over said first titanium silicide layer using a selective deposition process with an intermediate TiCl$_4$ to Si containing gas flow ratio and using a chloride containing gas of a material selected from the group consisting of HCL and ClF3; said first and second titanium suicide layers forming a titanium silicide contact layer.

8. The method of claim 5 wherein said titanium silicide contact layer is formed by forming first insulating layer having a contact opening on a substrate;
 a) insitu depositing a first C49-TiSi$_x$ layer over said substrate and depositing a Ti layer over said first insulating layer;
 b) etching said Ti layer to remove said Ti layer over said first insulating layer;
 c) rapid thermal annealing said first C49-TiSi$_2$ layer forming a titanium silicide contact layer over said substrate in said contact opening; said Titanium silicide contact layer composed of C54-TiSi2.

9. A method of forming a contact structure composed of a Titanium silicide layer/Ti—O—N barrier layer for contacting a substrate of a semiconductor device; comprising the steps of:
 a) forming a titanium silicide contact layer on said substrate in said contact opening;
 b) forming a barrier layer over said silicide contact layer; said barrier layer is composed of Ti—N—O and said barrier layer is formed using a nitridation in a nitrogen and oxygen containing ambient; and
 c) forming a metal plug over said TiN barrier layer; said metal plug composed of a material selected from the group consisting of Al and W.

* * * * *